United States Patent
Tule et al.

(10) Patent No.: US 10,082,537 B2
(45) Date of Patent: *Sep. 25, 2018

(54) APPARATUS AND METHODS FOR TESTING ELECTRONIC DEVICES

(71) Applicant: SKYWORKS SOLUTIONS, INC., Woburn, MA (US)

(72) Inventors: Jesus Alejandro Tule, Mexicali (MX); Bernard Binuya Carpio, Mexicali (MX); Jesus Alberto Gamez, Mexicali (MX); Daniel Murillo, Mexicali (MX); Adrian Flores Baca, Simi Valley, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/669,887

(22) Filed: Aug. 4, 2017

(65) Prior Publication Data

US 2018/0017618 A1  Jan. 18, 2018

Related U.S. Application Data

(63) Continuation of application No. 14/291,399, filed on May 30, 2014, now Pat. No. 9,726,718.

(51) Int. Cl.
*G01R 31/28* (2006.01)

(52) U.S. Cl.
CPC ................ *G01R 31/2889* (2013.01)

(58) Field of Classification Search
None
See application file for complete search history.

(56) References Cited

U.S. PATENT DOCUMENTS

| | | |
|---|---|---|
| 4,357,062 A | 11/1982 | Everett |
| 4,667,155 A | 5/1987 | Coiner et al. |
| 4,912,980 A | 4/1990 | Baughn |
| 5,450,017 A | 9/1995 | Swart |
| 5,966,023 A | 10/1999 | Burgers et al. |
| 6,259,265 B1 | 7/2001 | Han et al. |
| 6,304,092 B1 | 10/2001 | Jordan |
| 6,307,386 B1 | 10/2001 | Fowler et al. |
| 6,310,486 B1 | 10/2001 | Trevisan et al. |
| 6,414,510 B1 | 7/2002 | Takeuchi et al. |
| 6,999,888 B2 | 2/2006 | Repko et al. |
| 7,301,326 B1 | 11/2007 | Green et al. |

(Continued)

*Primary Examiner* — Jermele M Hollington
*Assistant Examiner* — Suresh K Rajaputra
(74) *Attorney, Agent, or Firm* — Chang & Hale LLP

(57) ABSTRACT

Apparatus and methods for testing electronic devices. In some embodiments, a fixture for testing an electronic device can include a support frame including a base and a pair of side supports implemented on respective sides of the base, with at least one of the side supports including a plurality of features for mounting of a test hardware, and the base being configured to support a first test board. The fixture can further include an upper support positioned above the support frame and configured to support a second test board. The fixture can further include a suspension mechanism implemented to couple the upper support to the side supports such that the upper support is movable relative to the support frame to accommodate a misalignment between the upper support and the base.

20 Claims, 9 Drawing Sheets

(56) References Cited

U.S. PATENT DOCUMENTS

| | | |
|---|---|---|
| 7,400,135 B1 | 7/2008 | Bartholomew et al. |
| 7,504,822 B2 | 3/2009 | Parrish et al. |
| 7,528,616 B2 | 5/2009 | Grilletto et al. |
| 7,616,019 B2 | 11/2009 | Oshetski et al. |
| 8,720,875 B2 | 5/2014 | Di Stefano et al. |
| 8,760,182 B2 | 6/2014 | Wood et al. |
| 9,134,387 B1 | 9/2015 | Gajda et al. |
| 9,151,693 B1 | 10/2015 | Yang et al. |
| 9,726,718 B2 * | 8/2017 | Tule .................. G01R 31/2889 |
| 2001/0052782 A1 | 12/2001 | Brule |
| 2002/0196043 A1 | 12/2002 | Tsui et al. |
| 2002/0197892 A1 | 12/2002 | Allen et al. |
| 2004/0190274 A1 | 9/2004 | Saito et al. |
| 2005/0040812 A1 | 2/2005 | Holt et al. |
| 2006/0273815 A1 | 12/2006 | Johnston et al. |
| 2007/0075726 A1 | 4/2007 | Chan et al. |
| 2008/0100322 A1 | 5/2008 | Trudeau et al. |
| 2011/0074457 A1 | 3/2011 | Roderick et al. |
| 2014/0062516 A1 | 3/2014 | Rashidzadeh et al. |
| 2015/0130496 A1 | 5/2015 | Anderson et al. |
| 2015/0177314 A1 | 6/2015 | Tran |

\* cited by examiner

APPARATUS AND METHODS FOR TESTING
ELECTRONIC DEVICES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. application Ser. No. 14/291,399 filed May 30, 2014, entitled MODULAR TEST FIXTURE, the benefit of the filing date of which is hereby claimed and the disclosure of which is hereby expressly incorporated by reference herein in its entirety.

BACKGROUND

Field

The present disclosure generally relates to test fixtures for electronic chips and devices.

Description of the Related Art

During production of electronic chips and devices, the devices undergo a series of end of line tests to ensure product quality and integrity. For each product, a test fixture is designed that interfaces with the various pieces of test equipment. The cost of test fixtures can increase significantly with increased product complexity, specifically with the inclusion of RF testing hardware. Due to the complexity and precision required to test the products, individualized test fixtures need to be built for each new product. Even though many of the products are similar, and products within the same families shared similar features, or even the same or similar test procedures, many times the test fixtures are not compatible. As such additional test hardware and components are required for each test fixture, contributing to high inventory cost and a seemingly unnecessary duplication of test hardware.

The test fixtures have to be manufactured to very high degree of precision. For example, a device under test (DUT) may only be one millimeter thick and a misalignment of a fraction of a millimeter can cause problems during testing. As such each test fixture is designed specifically for the DUT. Even with this degree of precision, normal operation of the test equipment, such as vibration, can cause problems during testing. Additionally, if a component on the test fixture breaks or needs to be replaced, it can require a significant amount of time and an almost complete disassembly and reassembly of the fixture.

SUMMARY

In some implementations, the present disclosure relates to a modular test fixture for testing an electronic device. The modular test fixture includes a support frame having a base, and a substrate having a plurality of test components. The substrate is coupled to the base. The modular test fixture further includes an upper support positioned above the support frame, and a plurality of suspension elements that each extend between the upper support and the support frame. The suspension elements couple the upper support to the support frame. The upper support is movable relative to the support frame. The modular test fixture further includes a daughterboard module coupled to the upper support. The modular test fixture further includes a daughterboard having a test device interface. The daughterboard is coupled to the daughterboard module and operatively coupled to the plurality of test components.

In some embodiments, the modular test fixture can further include a plurality of guide posts, with the upper support being movable along the plurality of guide posts. In some embodiments, the upper support can be movable along a single axis. In some embodiments, the suspension elements can be springs. In some embodiments, the suspension elements can be compressible along a vertical axis. In some embodiments, the suspension elements can be configured to compress when a force is applied to the daughterboard. In some embodiments, the modular test fixture can further include a securing plate positioned adjacent the daughterboard module and coupled to the upper support.

According to a number of implementations, the present disclosure relates to a test fixture that includes a support frame having a substrate configured to receive a plurality of test components. The test fixture further includes an upper support having a daughterboard module coupling interface. The test fixture further includes a plurality of suspension elements that extend between the upper support and the support frame forming a gap between the support frame and the upper support. The suspension elements couple the upper support to the support frame. The suspension elements are configured to compress when a force is applied to the upper support thereby reducing the size of the gap between the support frame and the upper frame.

In some embodiments, the suspension elements can be springs. In some embodiments, the suspension elements can compress along a vertical axis. In some embodiments, the test fixture can further include a daughterboard module coupled to the upper support.

In a number of teachings, the present disclosure relates to a method for testing an electronic device. The method includes positioning a modular test fixture for placement of test devices by an automated device placement system, where the modular test fixture includes a daughterboard module. The method further includes placing a test device in the daughterboard module using the automated system. The method further includes moving the daughterboard to align with the automated system for placement of the test device. A plurality of suspension elements are used to align the daughterboard module with the automated device placement system.

In some embodiments, the method can further include the step of testing the electronic device. The method can further include the step of removing the test device from the daughterboard module with the automated system.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
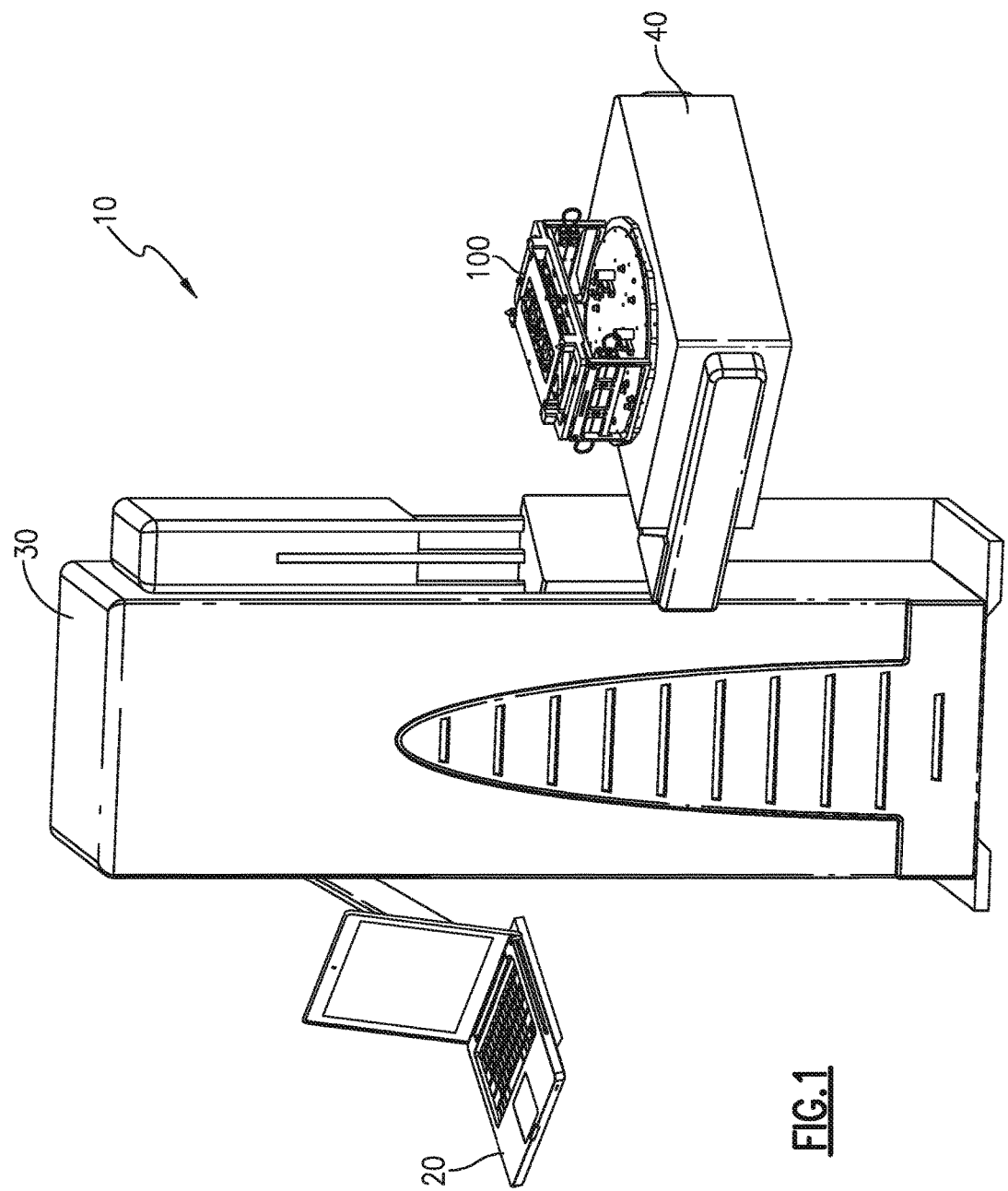
FIG. 1 illustrates an embodiment of a test station.

FIG. 1 illustrates an electronic device test station 10. The test station has a user control panel interface 20, a test apparatus 30, a control arm 40, and a modular test fixture 100. The modular test fixture can provide one or more advantageous features as described herein. The test station is controlled by the user control panel interface. Commercial embodiments of automated test equipment or an automated test station can include the ASL3000 model manufactured by LTX-Credence. The user control panel interface 20 can be a computer, touch screen, or other interface that allows a user to control the test station 10. The test apparatus 30 runs the tests on a device under test (DUT) and positions the control arm 40 and the test fixture 100. The DUT will go through a series of end of line tests to check the integrity and performance of the DUT. Every DUT undergoes testing prior to processing and shipment. Examples of the tests performed on the DUT can include DC Tests, RF Power levels, Gain, Power Added Efficiency (PAE), Isolation, Harmonics Distortion, Adjacent Channel Power Ratio (ACPR), S-Parameters, Path losses, and other tests. Automated handler devices, such as a pick and place machines, are responsible for manipulating the DUT and positioning the DUT for testing. Commercial embodiments of automated pick and place machines or handlers include the NS6000 and NS8000 models available from Seiko-Epson.

FIGS. 2 through 5 illustrate a modular test fixture 100. The modular test fixture 100 has a support frame 110, an upper support 120, a plurality of suspension elements 122, a motherboard 130, and a plurality of daughterboard modules 140.

The support frame 110 includes a support base 112, a pair of side supports 114, a pair of horizontal supports 116, and a plurality of guideposts 118. The support base 112 is substantially circular. The support base 112 has a plurality of apertures or mounting holes (not shown). The mounting holes are configured to mount the test fixture 100 to a test station, such as the test station 10 illustrated in FIG. 1. The support base 112 has additional mounting holes configured to mount a motherboard 130 to the support base 112. The motherboard is coupled to the support base using fasteners, such as screws. The support base 112 can have a plurality of standoffs that are configured to create a gap between the base support 112 and the motherboard 130. Generally, the support base 112 is configured to provide a support for the support frame 110. The support base 112 is further configured provide a base for the motherboard and is configured to couple the test fixture 100 to a test station. As such the support base can be any shape or design that adequately meets the design constraints and parameters of the test station and the test fixture. For example the support base 112 can be square, rectangular, triangular, or another geometric shape.

A pair of vertical test fixture supports 114 is positioned on opposite sides of the support base 112. The side supports have a height, width and thickness. The side supports 114 are mirror images of each other. The side support 114 has a plurality of crossbars 115 positioned approximately in the middle of the side supports. The crossbars 115 have a plurality of mounting holes. The crossbars are configured to mount test hardware 150 that is positioned in the interior portion of the test fixture 100. In some embodiments the crossbars can be configured to mount test hardware 150 to the exterior of the test fixture 100. The horizontal support 116 extends between the side supports 114. The side support has a plurality of orifices or open sections. In some embodiments the side support may be solid.

The horizontal supports 116 are positioned near the top edge of the side supports 114. The horizontal support 116 adds rigidity and structural stability to the support frame 110. In some embodiments the horizontal support 116 can be a single support beam that extends between the side supports. In other embodiments the horizontal support 116 can be a solid support that extends the entire width of the side supports 114. In other embodiments of the support frame 110 there are no horizontal supports 116.

A plurality of guideposts or guide elements 118 extend from the top surface of the side supports 114. In this embodiment there are four guideposts 114. The guideposts 118 extend vertically from the top surface of the side support 114. The guideposts 118 have a cylindrical body and a head portion. The body portion is substantially smooth and has a uniform diameter. The head portion of the guideposts flares outwards and has a larger diameter than the body portion. In this embodiment there are two guideposts 118 positioned on the top surface of each side support 114. In other embodiments there may be more or less guide elements positioned on the side wall. For example, there may be a single central guidepost or there may be a three or more guideposts positioned on the side support 114. In other embodiments the guide elements may be other shapes, such as a square or oval. The guideposts 118 are configured to be positioned within the guidepost hole or interface 126 on the upper support 120. The body of the guidepost 118 is configured to have a smaller diameter than the diameter of the guidepost interface 126 and the head of the guidepost 118 is configured to have a larger diameter than the diameter of the guidepost interface 126. The length of the guideposts 118 can be modified to provide additional vertical travel. In some embodiment the diameter of the guideposts 118 can be modified to add additional lateral travel.

The motherboard 130 is a circular substrate that has a plurality of electrical interconnects and mounting holes. The motherboard is coupled to the support base 112 through the mounting holes. The substrate is configured to mount a plurality of hardware components for use during testing. The hardware components can include surface mounted electrical components, such as directional couplers, RF filters, RF attenuators, resistors, capacitors, RF switches, and other hardware components. The motherboard is configured to be positioned on the support base 112, such that the motherboard is independent from the support structure.

The upper support or daughterboard support 120 has a plurality of guidepost holes or interfaces 126, a daughterboard module recess 124, a plurality of standoffs 128, and a plurality of mounting holes. The upper support 120 is rectangular in shape. The upper support 120 is substantially the same width as the side supports 114 and extends in length to the outer edges of the side supports 114. The plurality guidepost interfaces or holes 126 are positioned on both ends of the upper support 120. In this embodiment there are four guidepost holes 126, two on each end of the upper support 120. Each guidepost interface 126 is the same. The guidepost interface extends through the upper support 120. The shape and diameter of the guidepost interface 126 is configured to match the size and shape of the guidepost 118. The guidepost interface is configured to be larger than the guidepost 118. The guidepost interface 126 is configured to restrain the movement of the upper support so that in moves along the vertical axis. As such the guidepost interface 126 sized so that the upper support 120 can translate vertically on the guidepost 118 without lateral movement. In some embodiments the guidepost 118 has a smaller diameter guidepost that provides the upper support 120 some lateral movement relative to the support structure 110.

Figure 2:
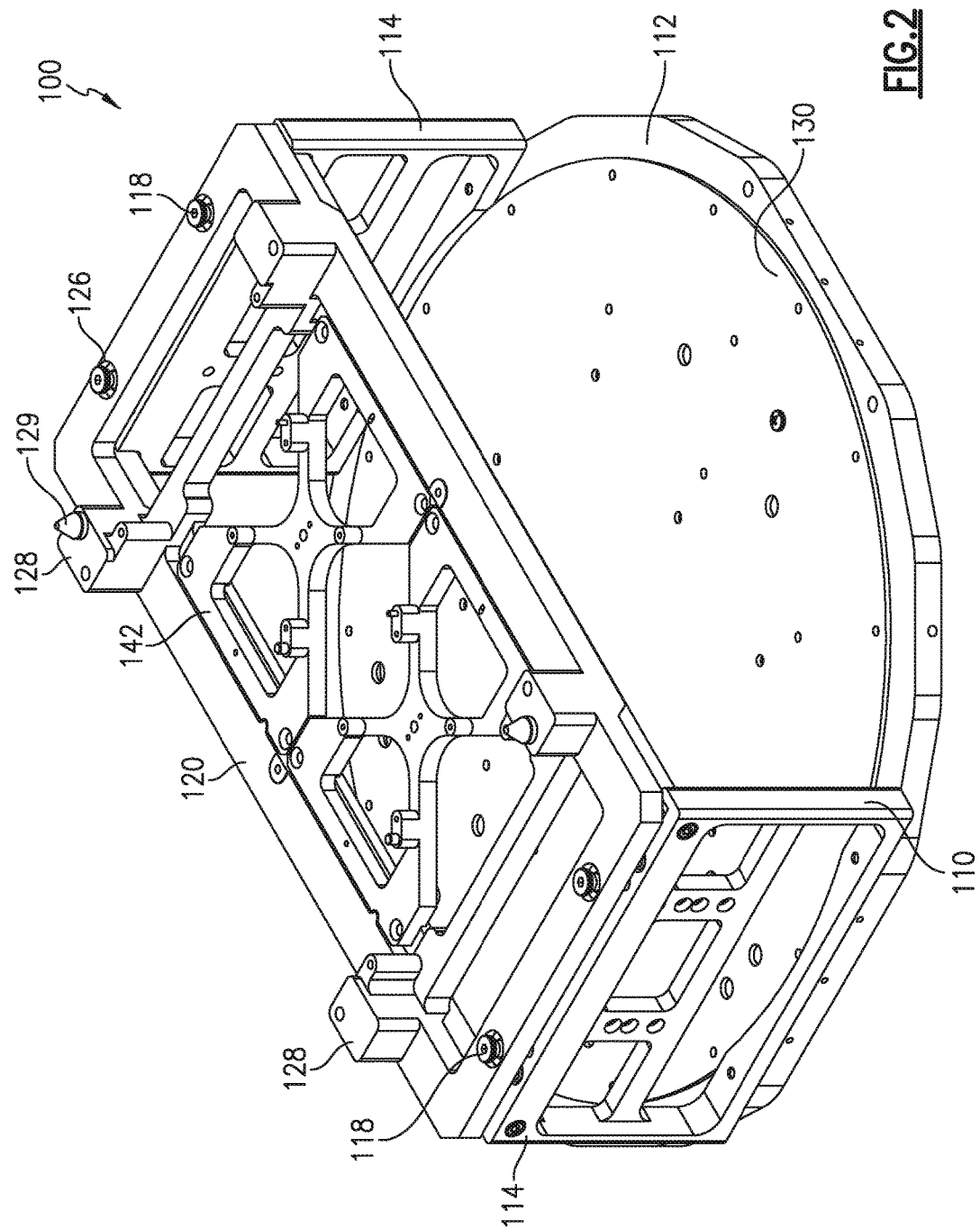
FIG. 2 illustrates an embodiment of a test fixture.
Figure 3:
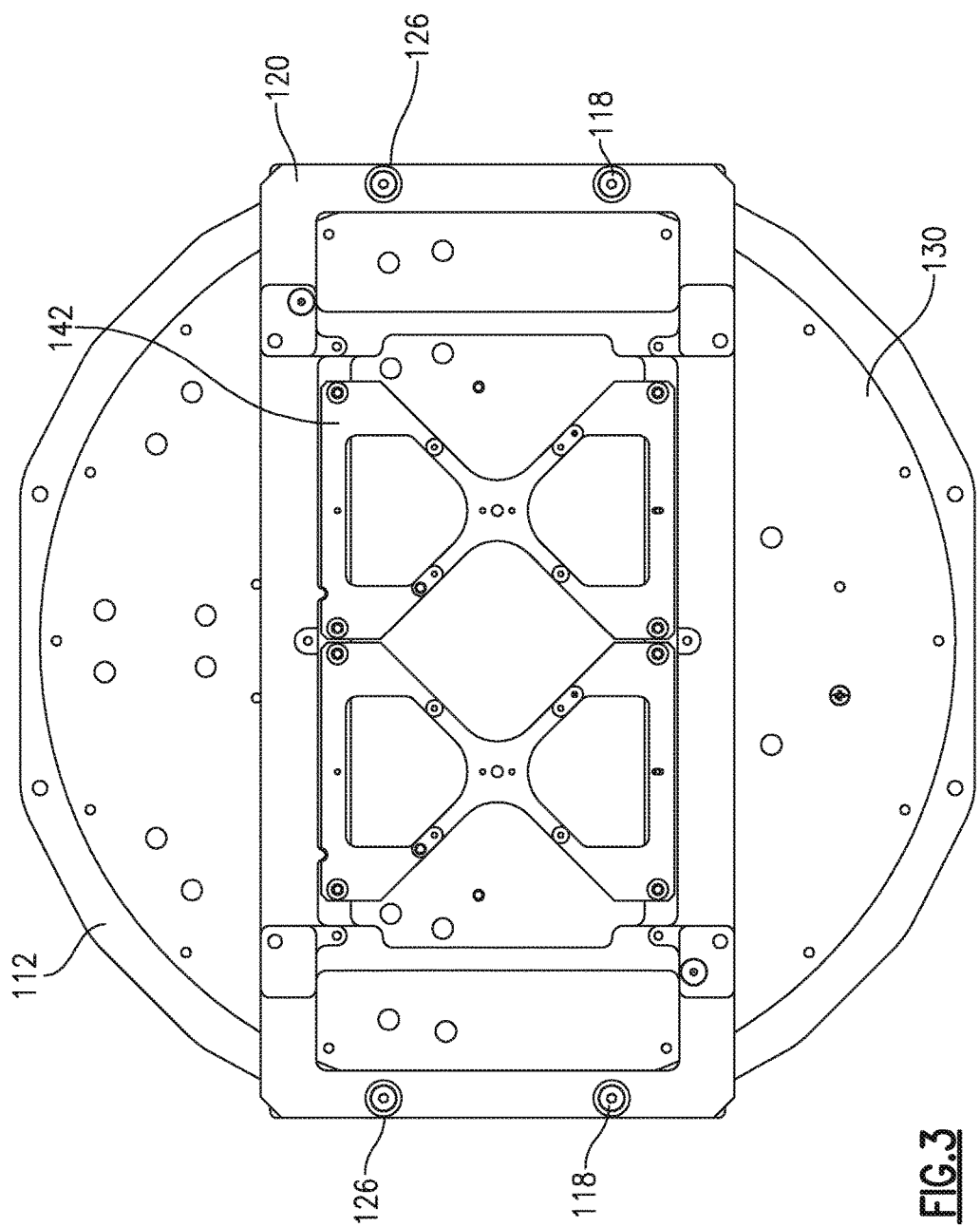
FIG. 3 is a top view of the embodiment of the test fixture from FIG. 2.
Figure 4:
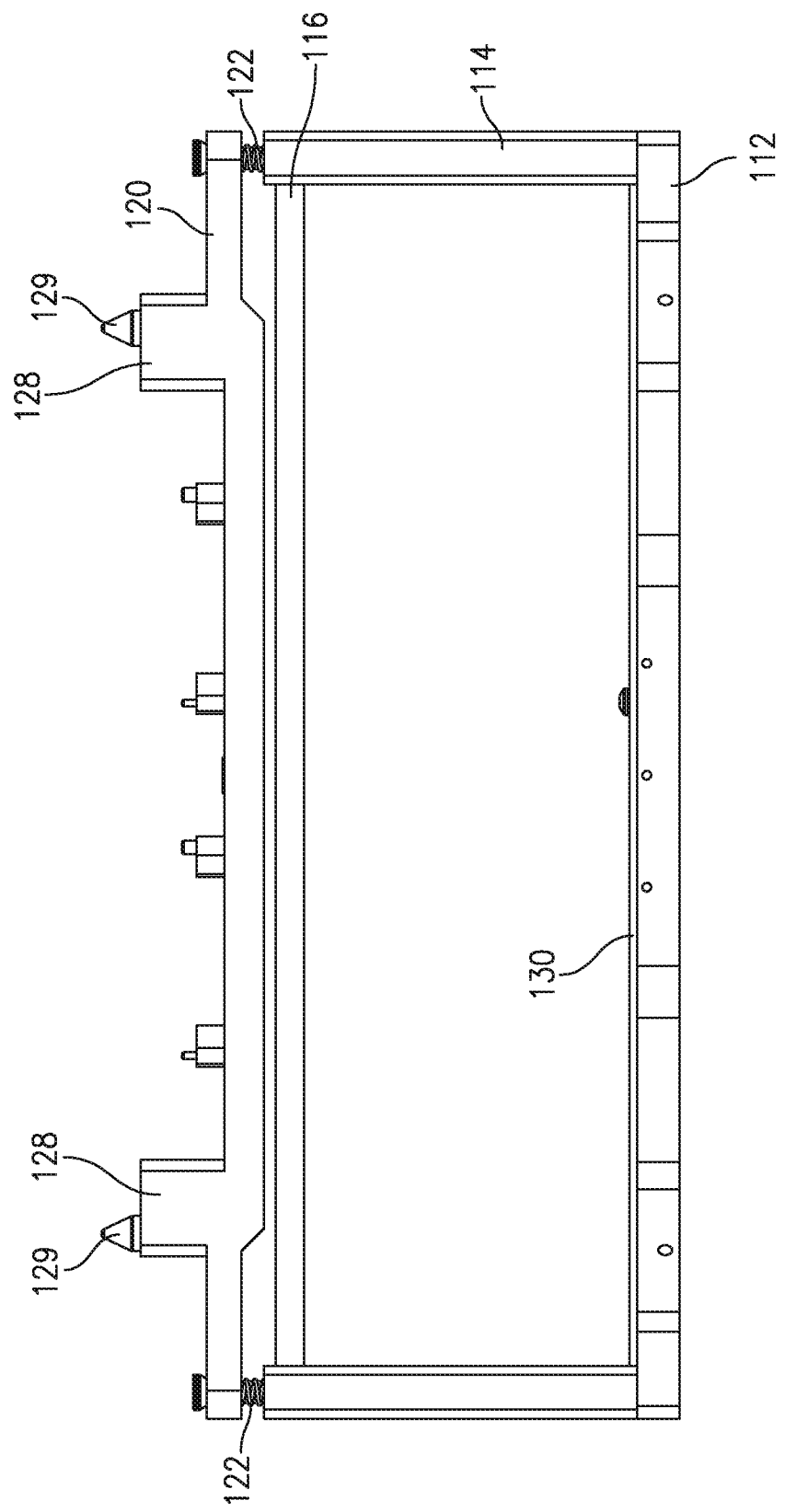
FIG. 4 is a side view of the embodiment of the test fixture from FIG. 2.
Figure 5:
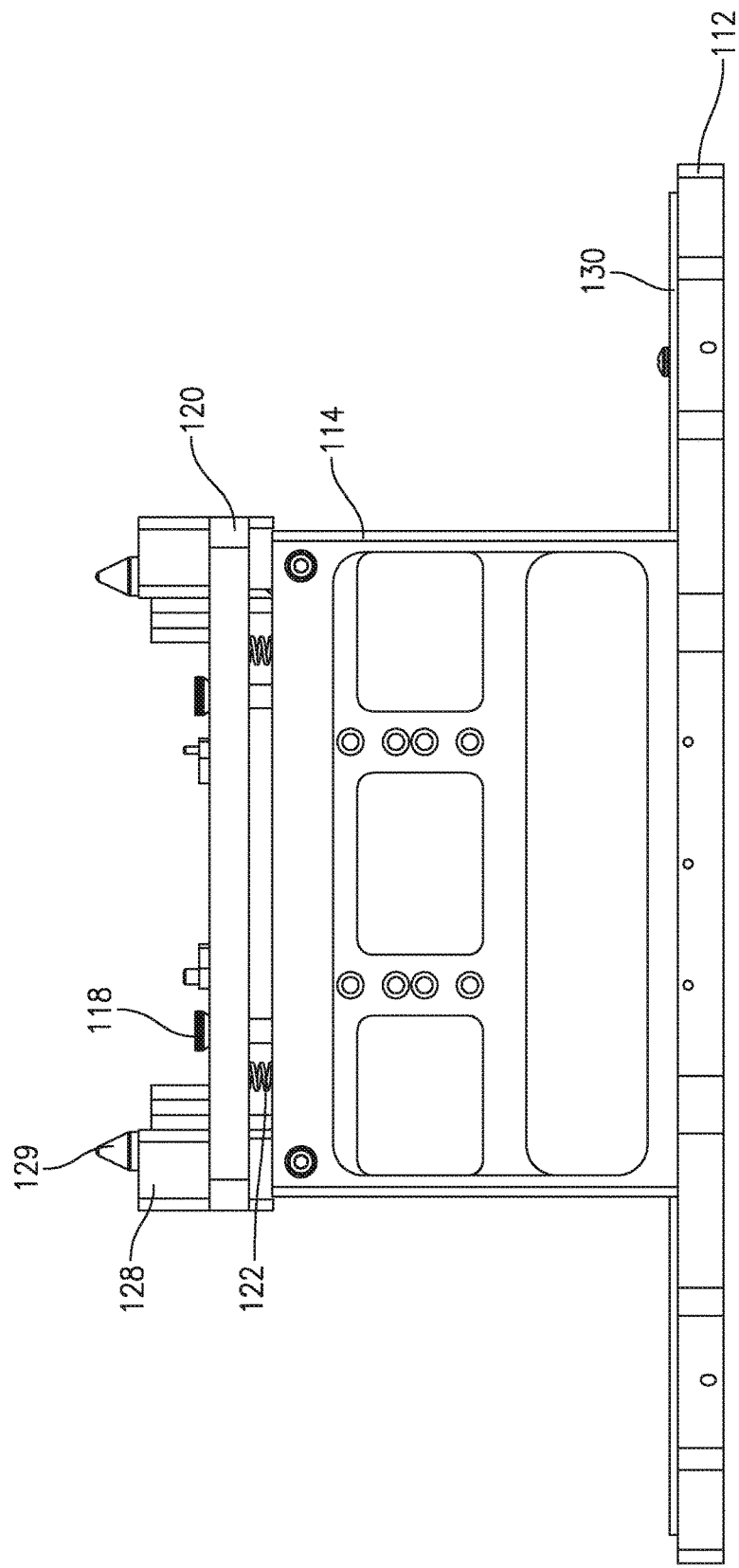
FIG. 5 is an end view of the embodiment of the test fixture from FIG. 2.

The daughterboard module recess 124 is positioned on the top side of the upper support 120. The recess 124 extends into the upper support a uniform depth and is rectangular in shape. In this embodiment the module recess is configured to house two daughterboard modules 140. The recess 124 has a plurality of mounting holes that are configured to secure the daughterboard module 140 to the upper support 120. The size and shape of the recess 124 is dependent upon the size and shape of the daughterboard modules 140. In some embodiments the module recess 124 may be configured to house more or less modules, for example a module recess 124 may be configured to house three or more daughter boards. In some embodiments there may be no module recess 124 and the daughterboard module 140 may be coupled to the top surface of the upper support 120. The positioning of two daughterboard bases 142 within the module recess 124 is illustrated in FIGS. 2 and 3.

The standoffs 128 are positioned at the corners of the daughterboard module recess. The standoffs are configured to position and couple a security plate 146 to the upper support 120 and over the daughterboard module 140. The standoffs 128 also have handler positioning elements 129 located on opposite corners. The handler positioning elements are cone shaped elements that extend vertically from the top of the standoff. The handler positioning elements 129 are configured to position an automated handler relative to the test fixture. The handler positioning elements 129 are used to establish the spatial coordinates of the test fixture, specifically the planar coordinates (x-axis and y-axis) and the vertical coordinates (z-axis). The spatial coordinate information is used to determine the position of the DUT socket 162 on the daughterboards 160.

The suspension elements 122 are positioned between the top surface of the side support 114 and the bottom surface of the upper support. In this embodiment the suspension elements are compression springs. In this embodiment there are four springs 122, with two positioned on each end of the test fixture 100. The suspension elements 122 help maintain the vertical, lateral, and/or angular positioning of the upper support 120 and the motherboard module 140. The travel of the suspension elements can be controlled by the size of the suspension element 122 and the guidepost 118. The flexible positioning and alignment of the suspension elements helps eliminate problems associated with testing. For example the flexible vertical, lateral, and/or angular alignment helps eliminate contact problems due to handler vibration and test head misalignment. The suspension elements 122 can also help minimize problems associated with control arm 40 misalignment. In other embodiments the suspension elements may be other devices such as a pneumatic suspension device. The spatial positioning of the test fixture is important during testing. Misalignment of the test fixture 100 can result in erroneous test results. For example, RF testing measurements depend upon both the alignment of the DUT and the pressure of the DUT on the test interface. An incorrect amount of pressure caused by misalignment of the test fixture 100 can result in poor signal quality or erroneous test results.

Figure 6:
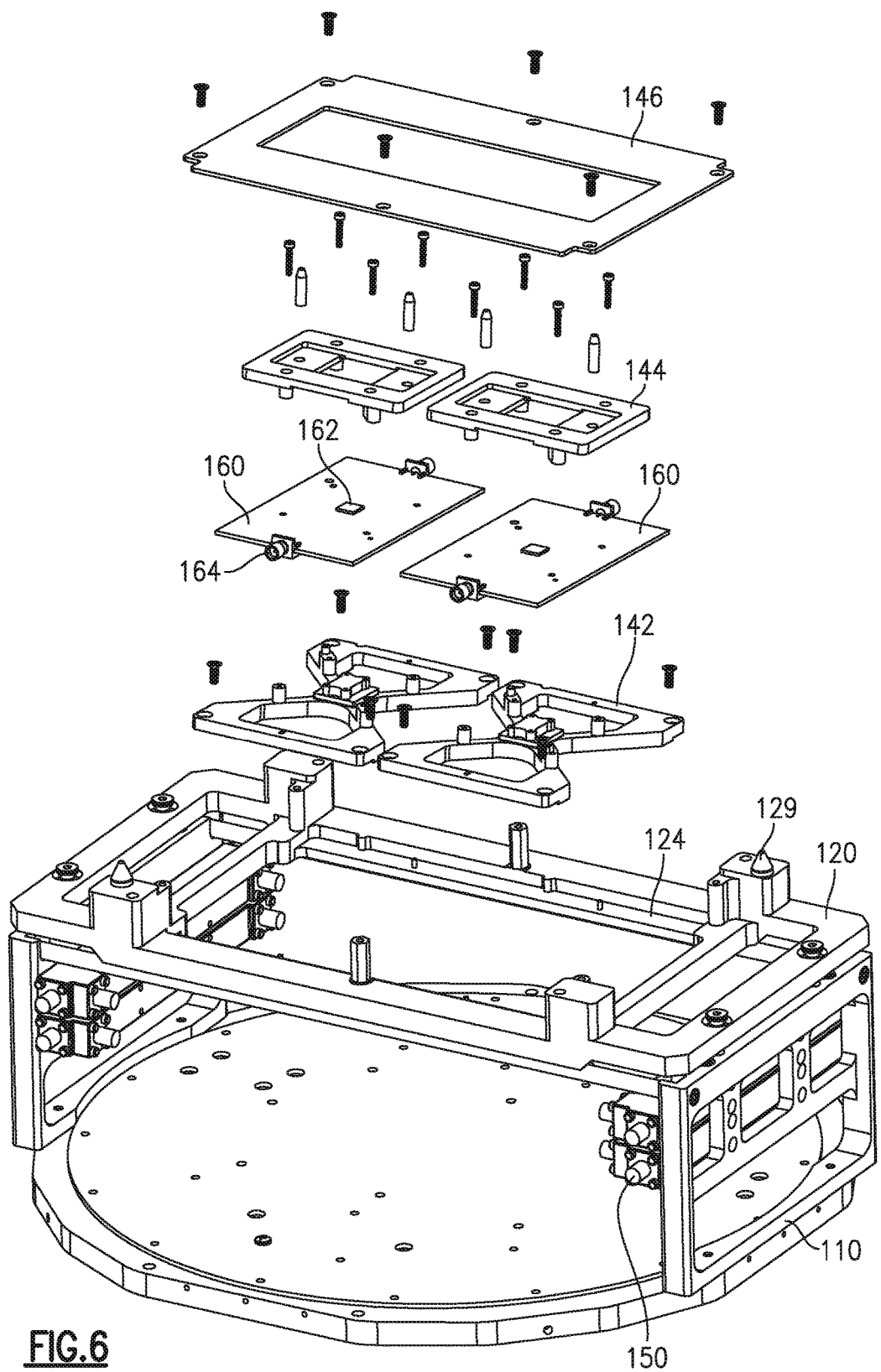
FIG. 6 is an exploded view of an embodiment of a test fixture and a modular daughterboard assembly.
Figure 7:
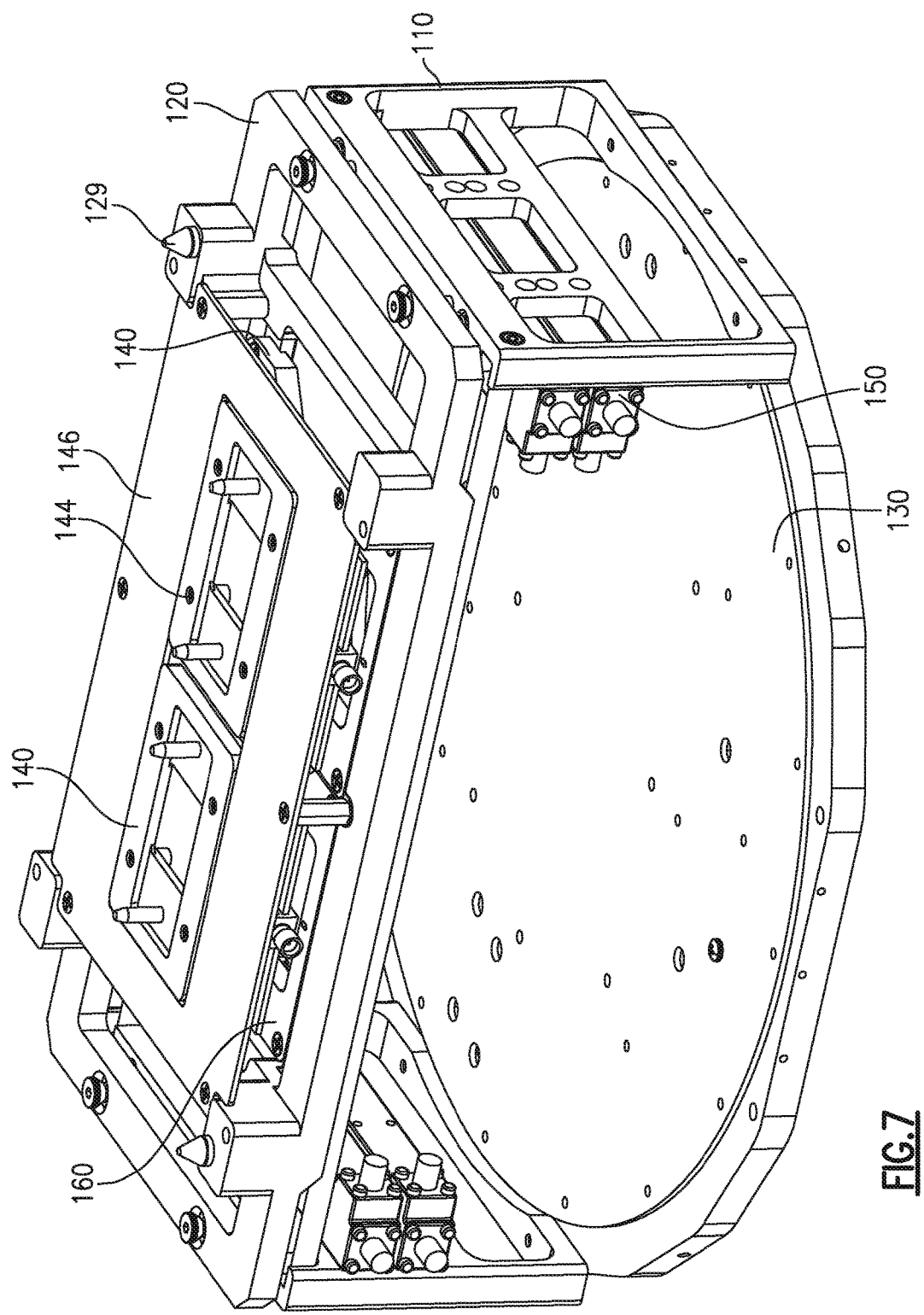
FIG. 7 illustrates an assembled view of the embodiment of the test fixture and modular daughterboard assembly.

FIGS. 6 and 7 illustrate the assembly of the daughterboard module 140. The daughterboard module 140 includes a daughterboard base 142, a daughterboard 160, a daughterboard securing member 144, and a security plate 146. The daughterboard is a substrate with a device testing interface or DUT test socket 162, a plurality of electronic interconnects, and a plurality of connectors 164. The DUT socket 162 is configured to interface with the device under test. The connectors 164 are configured to interface with the test hardware. In other embodiments the daughterboard can have more or less connectors.

The daughterboard base 142 has a plurality of mounting holes configured to secure the daughterboard base 142 within the daughterboard module recess 124. The daughterboard base 142 has another plurality of mounting holes that are configured to align with mounting holes on the daughterboard securing member 144 and the daughterboard 160. The daughterboard 160 is configured to be positioned between the daughterboard base 142 and the daughterboard securing member 144. The daughterboard base 142 and the daughterboard securing member 144 have standoffs that are configured to insulate the daughterboard from the base 142, the securing member 144. The security plate 146 has an orifice that is positioned around the daughterboard securing members 144 when the security plate 146 is coupled to the standoffs 128 on the upper support 120. The security plate 146 is configured to protect the daughterboard assembly 160. The DUT socket 162 is accessible through the security plate 146 and the securing member 144.

Figure 8:
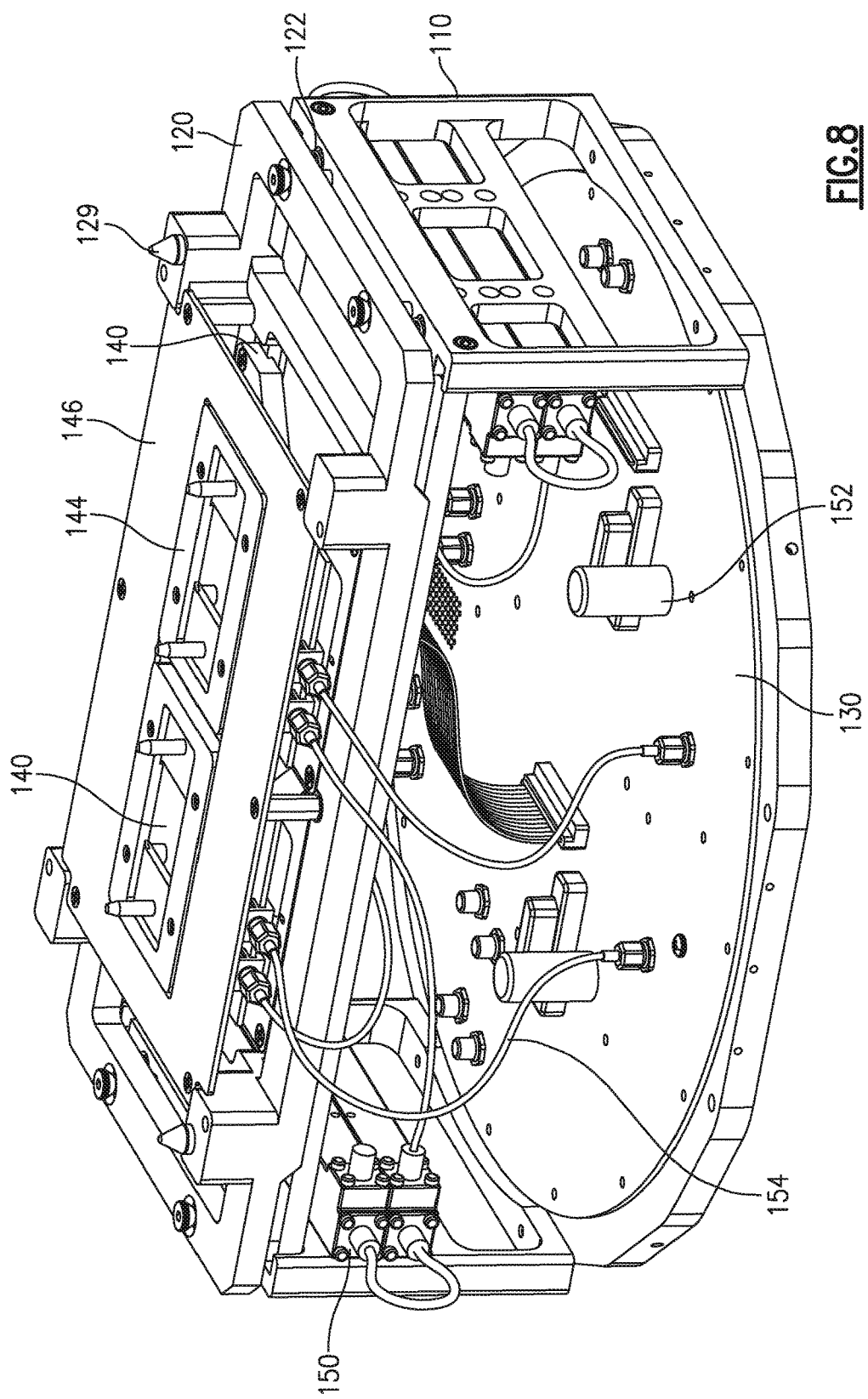
FIG. 8 illustrates an embodiment of a test setup for a test fixture and modular daughterboard assembly.

FIG. 8 shows an embodiment of a test setup for use with the modular test fixture 100. In this embodiment of the test setup, the test hardware includes surface mounted components 152, frame mounted test hardware 150, and a plurality of cables 154. The test hardware can include directional couplers, filters, attenuators, and other components. The specific test hardware configuration will be dependent upon the specific testing that the DUT requires. The test setup can be configured to test a series of test input signals, output signals, RF signals, cellular signals, wireless signals, and other signals as required. The cables 154 are configured to operatively couple the daughterboard 160 to the test hardware 150, 152.

The test fixture 100 is configured so that the cables 154 and hardware components 150, 152 are positioned within the footprint of the test fixture. Keeping the components and cables within the footprint of the test fixture reduces the chances of the cables and components being damaged. The hardware components are also configured to avoid long cables with sharp turns. Long cables can cause unstable measurements resulting in yield problems. The better layout enables a better component distribution and shorter RF cables, which can increase robustness for production.

Figure 9:
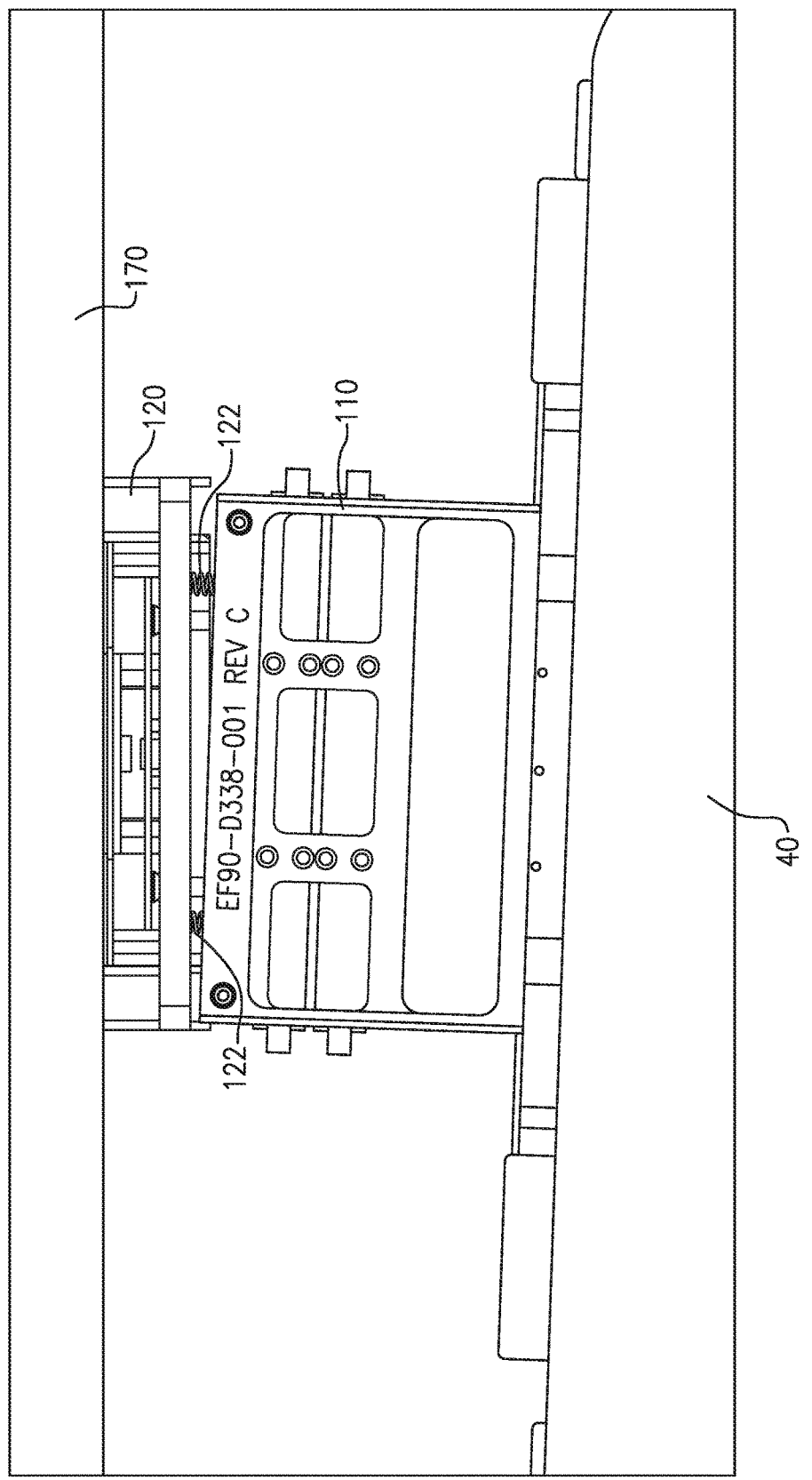
FIG. 9 illustrates the operation of the modular test fixture on an automated test station.

FIG. 9 illustrates how the suspension elements 122 can adjust the alignment of the modular test fixture 100 to align properly with an automated test handler 170. The modular test fixture 100 undergoes testing at a test station, such as the test station 10 described in association with FIG. 1. The test station is located within the operational proximity of an automated test handler 170. The automated test handler 170, such as a pick and place machine, is responsible for manipulating the DUT and positioning the DUT within the DUT socket 162 on the daughterboard 160. The test fixture 100 is coupled to a control arm 40. The alignment of the motherboard and DUT is determined by the positioning of the test fixture 100 on the control arm 40 and the positioning of the daughterboard module 140 within the test fixture 100. The suspension elements can compensate for misalignment of the handler 170 and the control arm 40. In some embodiments the control arm 40 is controlled manually by the user, and in some embodiments the arm 40 is automated by the system. The alignment of the test fixture 100 can be critical to the proper performance of the test procedure. Some DUTs can be a one millimeter thick device and a fraction of a millimeter, such as 0.1 mm, can cause problems if the device is not properly aligned. For example, during RF testing the test procedure needs the proper pressure as well as the proper alignment. Misalignment can produce poor yields, damage the DUT and/or the daughterboard.

The suspension elements 122 on the test fixture 100 adjust the alignment of the daughterboard 160 to compensate for misalignment of the test fixture 100 relative to the handler 170. The control arm 40 positions the test fixture 100 relative to an automated test handler 170. The automated test handler 170 positions a DUT on the DUT socket 162 of the daughterboard 160. If the test fixture 100 does not have the correct alignment, the suspension elements 122 can adjust the alignment of the upper support 120 and the daughterboard 160 to compensate for the misalignment. An example of the misalignment of the test fixture 100 relative to the handler 170 is illustrated in FIG. 9. The suspension elements 22 can help offset angular and vertical misalignment of the handler 170 relative to the control arm 40. The suspension elements 122 adjust the alignment by compressing and translating along the guideposts. The suspension elements 122 can compress differently relative to each other. The suspension elements 122 are compressed by the force that is applied by the handler when it is positioning the DUT within the DUT socket 162. Preferably, the force required to compress the suspension elements is not so great that it damages the DUT or interferes with the test procedures. Different suspension elements can be used to adjust the stiffness and travel of the suspension elements.

The modular nature of the daughterboard modules 160 makes it easier to replace or repair broken modules. The modules can be replaced individually without disassembling the entire test fixture 100. Each module can be removed and replaced individually without affecting other modules. The replacement of modules can be done in a fraction of the time that it takes to repair and replace a component on a non-modular test fixture. For example, a replacement of a daughterboard module can be performed in as little as ten minutes, whereas non-modular test fixture replacements could take up to an hour. Additionally, the modular nature of the test fixture allows the multiple products within product families to use the same test fixture rather than having to design and build a new test fixture for every product.

The test fixtures having one or more features as described herein can benefit in a number of ways. For example, the applicant has observed that there has been an increased yield in the testing of DUTs. Further, there is a reduced cost associated with the fixtures because multiple products can be tested using the same test fixture. There is also a reduced cost associated the maintenance and replacement of components within the test fixtures.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional subcomponents to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A fixture for testing an electronic device, comprising:
   a support frame including a base and a pair of side supports implemented on respective sides of the base, at least one of the side supports including a plurality of features for mounting of a test hardware, the base configured to support a first test board;
   an upper support positioned above the support frame and configured to support a second test board; and
   a suspension mechanism implemented to couple the upper support to the side supports such that the upper support is movable relative to the support frame to accommodate a misalignment between the upper support and the base.

2. The fixture of claim 1 wherein the respective sides of the base on which the pair of side supports are implemented include opposite sides of the base.

3. The fixture of claim 1 wherein the plurality of features for mounting of a test hardware includes a plurality of mounting holes.

4. The fixture of claim 1 wherein the suspension mechanism includes a plurality of suspension elements implemented between the upper support and the side supports.

5. The fixture of claim 4 wherein the suspension elements include springs.

6. The fixture of claim 5 further comprising a guide post implemented with each spring and configured to allow adjustment of spacing between the upper support and the respective side support at the location of the spring to thereby accommodate the misalignment.

7. The fixture of claim 4 wherein at least some of the suspension elements are compressible along a direction having a component parallel with a vertical axis when the fixture is placed on a horizontal surface.

8. The fixture of claim 4 wherein at least some of the suspension elements are configured to compress when a force is applied to the upper support.

9. The fixture of claim 1 wherein the first test board includes a motherboard, and the second board includes a daughterboard.

10. The fixture of claim 9 wherein the base is configured to support a circular shaped motherboard.

11. The fixture of claim 9 wherein the upper support is configured to support a daughterboard having a device-under-test.

12. The fixture of claim 9 wherein the upper support is configured to support a daughterboard having a socket for receiving a device-under-test.

13. The fixture of claim 12 further comprising a securing plate coupled to the upper support such that the securing plate is positioned above the daughterboard when the daughterboard is mounted to the upper support and the fixture is placed on a horizontal surface.

14. The fixture of claim 13 wherein the securing plate defines an opening dimensioned to allow positioning of the device-under-test on the socket of the daughterboard when the daughterboard is mounted to the upper support and secured by the securing plate.

15. A system for testing electronic devices, comprising:
a test apparatus configured to perform a test on an electronic device;
a fixture for holding the electronic device when the test apparatus performs the test, the fixture having a support frame that includes a base and a pair of side supports implemented on respective sides of the base, at least one of the side supports including a plurality of features for mounting of a hardware to facilitate the test, the base configured to support a first test board, the fixture further including an upper support positioned above the support frame and configured to support a second test board, the fixture further including a suspension mechanism implemented to couple the upper support to the side supports such that the upper support is movable relative to the support frame to accommodate a misalignment between the upper support and the base; and
a user control panel interface configured to facilitate the test of the electronic device.

16. The system of claim 15 further comprising a control arm coupled to the test apparatus and configured to support the fixture.

17. The system of claim 15 further comprising an automated handler device configured to position the electronic device onto the fixture for the test.

18. The system of claim 17 wherein the user control panel interface is further configured to control the automated handler.

19. The system of claim 15 wherein the test apparatus is configured to perform one or more radio-frequency related tests.

20. A method for testing an electronic device, the method comprising:
providing a test apparatus configured to perform a test on the electronic device;
positioning the electronic device on a fixture having a support frame that includes a base and a pair of side supports implemented on respective sides of the base, at least one of the side supports including a plurality of features for mounting of a hardware to facilitate the test, the base configured to support a first test board, the fixture further including an upper support positioned above the support frame and configured to support a second test board;
accommodating a misalignment between the upper support and the base with a suspension mechanism implemented between the upper support and the side supports; and
performing the test on the electronic device.

* * * * *